United States Patent
Far et al.

(10) Patent No.: US 11,416,218 B1
(45) Date of Patent: Aug. 16, 2022

(54) DIGITAL APPROXIMATE SQUARER FOR MACHINE LEARNING

(71) Applicant: Ali Tasdighi Far, San Jose, CA (US)

(72) Inventors: Ali Tasdighi Far, San Jose, CA (US); Jerry M. Collings, Paso Robles, CA (US)

(*) Notice: Subject to any disclaimer, the term of this patent is extended or adjusted under 35 U.S.C. 154(b) by 19 days.

(21) Appl. No.: 16/925,803

(22) Filed: Jul. 10, 2020

(51) Int. Cl.
*G06F 7/552* (2006.01)
*G06F 17/17* (2006.01)
*G06F 7/50* (2006.01)
*G06F 7/544* (2006.01)
*G06N 3/02* (2006.01)

(52) U.S. Cl.
CPC ............... *G06F 7/552* (2013.01); *G06F 7/50* (2013.01); *G06F 7/5443* (2013.01); *G06F 17/17* (2013.01); *G06N 3/02* (2013.01)

(58) Field of Classification Search
CPC .......... G06F 7/50; G06F 7/552; G06F 7/5443; G06F 17/17
See application file for complete search history.

(56) References Cited

U.S. PATENT DOCUMENTS

| | | | |
|---|---|---|---|
| 3,013,724 A | 12/1961 | Thompson et al. |
| 3,084,862 A | 4/1963 | Nathan |
| 3,102,951 A | 9/1963 | Nathan |
| 3,106,639 A | 10/1963 | Nathan |
| 3,120,605 A | 2/1964 | Nathan et al. |
| 3,197,626 A | 7/1965 | Platzer et al. |
| 3,253,135 A | 5/1966 | Collings et al. |
| 3,261,971 A | 7/1966 | Nathan |
| 3,296,429 A | 1/1967 | Nathan |
| 3,304,419 A | 2/1967 | Huntley, Jr. et al. |
| 3,536,904 A | 10/1970 | Jordan, Jr. et al. |
| 3,543,288 A | 11/1970 | Collings |
| 3,562,553 A | 2/1971 | Roth |
| 3,610,906 A | 10/1971 | Stampler et al. |
| 3,621,226 A | 11/1971 | Wittlinger |
| 3,633,005 A | 1/1972 | Leighton |
| 3,683,165 A | 8/1972 | Grobert et al. |

(Continued)

OTHER PUBLICATIONS

M. Bilal et al., FPGA Design for Statistics-Inspired Approximate Sum-of-Squared-Error computation in Multimedia Applications, IEEE Transactions on Circuits and Systems II: Express Briefs, vol. 59, No. 8, 2012 (Year: 2012).*

(Continued)

*Primary Examiner* — Emily E Larocque (57) ABSTRACT

Digital approximate squarer (aSQR)s utilizing apparatuses, circuits, and methods are described in this disclosure. The disclosed aSQR methods can operate asynchronously and or synchronously. For applications where low precisions is acceptable, fewer interpolations can yield less precise square approximation, which can be computed faster and with lower power consumption. Conversely, for applications where higher precision are required, more interpolations steps can generate more precise square approximation. By utilizing the disclosed aSQR method, precision objectives of a squarer approximation function can be programmed real-time and on the fly, which enables optimizing for power consumption and speed of squaring, in addition to optimize for the approximate squarer's die size and cost.

5 Claims, 7 Drawing Sheets

(56) References Cited

U.S. PATENT DOCUMENTS

| | | |
|---|---|---|
| 3,689,752 A | 9/1972 | Gilbert |
| 3,838,262 A | 9/1974 | Van De Plassche |
| 3,858,036 A | 12/1974 | Lunsford |
| 3,956,622 A | 5/1976 | Lyon |
| 3,956,643 A | 5/1976 | Hite |
| 3,959,639 A | 5/1976 | Köethmann |
| 4,001,602 A | 1/1977 | Birchenough |
| 4,004,141 A | 1/1977 | Curtis |
| 4,071,777 A | 1/1978 | Herrmann |
| 4,156,283 A | 5/1979 | Gilbert |
| 4,181,967 A | 1/1980 | Nash et al. |
| 4,308,471 A | 12/1981 | Misawa |
| 4,313,174 A * | 1/1982 | White .................... G06F 1/035 708/606 |
| 4,353,000 A | 10/1982 | Noda |
| 4,387,439 A | 6/1983 | Lin |
| 4,482,977 A | 11/1984 | Ross |
| 4,546,275 A | 10/1985 | Pena-Finol et al. |
| 4,572,975 A | 2/1986 | Bowers |
| 4,586,155 A | 4/1986 | Gilbert |
| 4,677,369 A | 6/1987 | Bowers et al. |
| 4,707,798 A | 11/1987 | Nakano |
| 4,817,028 A | 3/1989 | Masson et al. |
| 4,999,521 A | 3/1991 | Rusznyak |
| 5,042,001 A | 8/1991 | Brightman et al. |
| 5,107,150 A | 4/1992 | Kimura |
| 5,122,687 A | 6/1992 | Schmidt |
| 5,157,350 A | 10/1992 | Rubens |
| 5,220,525 A | 6/1993 | Anderson et al. |
| 5,254,889 A | 10/1993 | Han |
| 5,268,857 A | 12/1993 | Chen et al. |
| 5,283,579 A | 2/1994 | Tasdighi |
| 5,294,927 A | 3/1994 | Levinson et al. |
| 5,337,267 A | 8/1994 | Colavin |
| 5,381,352 A | 1/1995 | Shou et al. |
| 5,389,840 A | 2/1995 | Dow |
| 5,434,809 A | 7/1995 | Taniguchi |
| 5,617,346 A | 4/1997 | Inoue |
| 5,629,885 A | 5/1997 | Pirson et al. |
| 5,640,084 A | 6/1997 | Tero et al. |
| 5,668,710 A | 9/1997 | Caliboso et al. |
| 5,734,260 A | 3/1998 | Tasdighi et al. |
| 5,734,291 A | 3/1998 | Tasdighi et al. |
| 5,805,007 A | 9/1998 | Colli |
| 5,814,995 A | 9/1998 | Tasdighi |
| 5,912,834 A | 6/1999 | Kimura |
| 5,923,208 A | 7/1999 | Tasdighi et al. |
| 6,005,374 A | 12/1999 | Tasdighi |
| 6,018,758 A | 1/2000 | Griesbach et al. |
| 6,032,169 A | 2/2000 | Malzahn et al. |
| 6,054,823 A | 4/2000 | Collings et al. |
| 6,122,284 A | 9/2000 | Tasdighi et al. |
| 6,205,458 B1 | 3/2001 | Beiu |
| 6,260,056 B1 | 7/2001 | Dalal |
| 6,298,368 B1 | 10/2001 | Miller, Jr. |
| 6,301,598 B1 | 10/2001 | Dierke et al. |
| 6,393,453 B1 | 5/2002 | Purcell |
| 6,463,452 B1 | 10/2002 | Schulist |
| 6,490,608 B1 | 12/2002 | Zhu |
| 6,535,901 B1 | 3/2003 | Grisamore |
| 6,721,774 B1 | 4/2004 | Lee et al. |
| 6,763,367 B2 | 7/2004 | Kwon et al. |
| 6,883,011 B2 | 4/2005 | Rumynin et al. |
| 6,941,334 B2 | 9/2005 | Rogenmoser et al. |
| 6,978,426 B2 | 12/2005 | Parhi et al. |
| 6,982,588 B1 | 1/2006 | Lin et al. |
| 7,003,544 B1 | 2/2006 | Langhammer |
| 7,024,448 B2 | 4/2006 | Matsugaki et al. |
| RE39,385 E | 11/2006 | Brightman et al. |
| 7,139,788 B2 | 11/2006 | Talwar et al. |
| 7,197,292 B1 | 3/2007 | Kouwenhoven et al. |
| 7,206,801 B2 | 4/2007 | Chang et al. |
| 7,266,579 B2 | 9/2007 | Dupaquis et al. |
| 7,308,471 B2 | 12/2007 | Rumynin |
| 7,313,585 B2 | 12/2007 | Winterrowd |
| 7,318,080 B2 | 1/2008 | Berkeman |
| 7,334,200 B2 | 2/2008 | Parhi et al. |
| 7,437,401 B2 | 10/2008 | Zheng et al. |
| 7,562,106 B2 | 7/2009 | Lablans |
| 7,702,716 B2 | 4/2010 | Rösener |
| 7,739,324 B1 | 6/2010 | Das et al. |
| 8,407,277 B1 | 3/2013 | Das |
| 8,610,486 B1 | 12/2013 | Al-Absi et al. |
| 8,639,737 B2 | 1/2014 | Shearer |
| 8,707,225 B1 | 4/2014 | Das |
| 8,819,094 B2 | 8/2014 | Han et al. |
| 8,862,652 B2 | 10/2014 | Drane |
| 9,043,735 B1 | 5/2015 | Das et al. |
| 9,519,304 B1 | 12/2016 | Far |
| 9,684,489 B2 | 6/2017 | Thornton |
| 9,698,779 B2 | 7/2017 | Varadarajan et al. |
| 9,780,652 B1 | 10/2017 | Far |
| 9,793,912 B1 | 10/2017 | Ferris et al. |
| 9,921,600 B1 | 3/2018 | Far |
| 10,177,713 B1 | 1/2019 | Far |
| 10,198,022 B1 | 2/2019 | Far |
| 10,411,597 B1 | 9/2019 | Far |
| 10,491,167 B1 | 11/2019 | Far |
| 10,536,117 B1 | 1/2020 | Far |
| 10,560,058 B1 | 2/2020 | Far |
| 10,581,448 B1 | 3/2020 | Far |
| 10,594,334 B1 | 3/2020 | Far |
| 10,700,695 B1 | 6/2020 | Far |
| 2003/0184338 A1 | 10/2003 | Comer et al. |
| 2006/0170580 A1 | 8/2006 | Lauilzen et al. |
| 2008/0036523 A1 | 2/2008 | Nijrolder |
| 2014/0043087 A1 | 2/2014 | Li et al. |
| 2015/0123724 A1 | 5/2015 | Al-Absi et al. |
| 2016/0248437 A1 | 8/2016 | Zhang et al. |

OTHER PUBLICATIONS

J.M.P. Langlois, et al., Carry-Free Approximate Squaring Functions with O(n) Complexity and O(1) Delay, IEEE Transactions on Circuits and Systems II, Express Briefs, vol. 53, No. 5, 2006 (Year: 2006).*

M. Loukrakpam et al., Energy-efficient approximate squaring hardware for error-resilient digital systems, 2018 IEEE Electron Device Kolkata Converence (EDKCON), 2018 (Year: 2018).*

A. Far, "Small size class AB amplifier for energy harvesting with ultra low power, high gain, and high CMRR," 2016 IEEE International Autumn Meeting on Power, Electronics and Computing (ROPEC), Ixtapa, 2016, pp. 1-5.

A. Far, "Compact ultra low power class AB buffer amplifier," 2017 IEEE International Autumn Meeting on Power, Electronics and Computing (ROPEC), Ixtapa, 2017, pp. 1-6.

A. Far, "Subthreshold current reference suitable for energy harvesting: 20ppm/C and 0.1%/V at 140nW," 2015 IEEE International Autumn Meeting on Power, Electronics and Computing (ROPEC), Ixtapa, 2015, pp. 1-4.

A. Far, "Amplifier for energy harvesting: Low voltage, ultra low current, rail-to-rail input-output, high speed," 2016 IEEE International Autumn Meeting on Power, Electronics and Computing (ROPEC), Ixtapa, 2016, pp. 1-6.

A. Far, "Class AB amplifier with noise reduction, speed boost, gain enhancement, and ultra low power," 2018 IEEE 9th Latin American Symposium on Circuits & Systems (LASCAS), Puerto Vallarta, Mexico, 2018, pp. 1-4.

A. Far, "Low noise rail-to-rail amplifier runs fast at ultra low currents and targets energy harvesting," 2017 IEEE International Autumn Meeting on Power, Electronics and Computing (ROPEC), Ixtapa, 2017, pp. 1-6.

A. Far, "A 5 µW fractional CMOS bandgap voltage and current reference," 2013 IEEE Global High Tech Congress on Electronics, Shenzhen, 2013, pp. 7-11.

A. Far, "A 400nW CMOS bandgap voltage reference," 2013 International Conference on Electrical, Electronics and System Engineering (ICEESE), Kuala Lumpur, 2013, pp. 15-20.

A. Far, "Enhanced gain, low voltage, rail-to-rail buffer amplifier suitable for energy harvesting," 2017 IEEE International Autumn Meeting on Power, Electronics and Computing (ROPEC), Ixtapa, 2017, pp. 1-6.

(56) References Cited

OTHER PUBLICATIONS

A. Far, "Subthreshold bandgap voltage reference aiming for energy harvesting: 100na, 5 ppm/c, 40 ppm/v, psrr-88db," 2015 IEEE 5th International Conference on Consumer Electronics—Berlin (ICCE—Berlin), Berlin, 2015, pp. 310-313.

A. Far, "A 220nA bandgap reference with 80dB PSRR targeting energy harvesting," 2016 IEEE Canadian Conference on Electrical and Computer Engineering (CCECE), Vancouver, BC, 2016, pp. 1-4.

A. Far, "Sub-1 volt class AB amplifier with low noise, ultra low power, high-speed, using winner-take-all," 2018 IEEE 9th Latin American Symposium on Circuits & Systems (LASCAS), Puerto Vallarta, Mexico, 2018, pp. 1-4.

A. Far, "A low supply voltage 2 µW half bandgap reference in standard sub-µ CMOS," 2014 IEEE International Conference on Electronics, Computing and Communication Technologies (CONECCT), Bangalore, 2014, pp. 1-5.

A. Far, "Current reference for energy harvesting: 50um per side, At 70 nW, regulating to 125C," 2014 IEEE International Autumn Meeting on Power, Electronics and Computing (ROPEC), Ixtapa, 2014, pp. 1-5.

\* cited by examiner

DIGITAL APPROXIMATE SQUARER FOR MACHINE LEARNING

FIELD OF DISCLOSURE

The present invention relates to improvements in digital IC squarers, multipliers, dividers, including square and accumulate, and multiply and accumulate functions.

BACKGROUND

Non-linear signal processing, including the square function, as well as other mathematical functions such as multiplication are required in many computational applications, including machine learning and artificial intelligence where many of squarers and multipliers may be needed in a chip with low cost and low power consumption and mid-to-high resolution.

Generally speaking, die area (i.e., integrated circuit cost) and power consumption of conventional digital integrated circuit (IC) squarers and multipliers increase exponentially with increasing the digital input bit word length (i.e., resolution).

Until recently, innovations in semiconductor manufacturing and fabrication have lowered costs significantly and made very faster chips which has provided technology markets with the fuel to grow the digital economies with meaningful integrated circuit cost reductions year-after-year, consistent with the predictions of the Moore's law.

With Moore's law at the end of its rope, IC manufacturing and fabrication technologies have run out of steam to be the primary fuel for die size reduction. Despite the end of Moore's law, demand for both smaller ICs and also ones with higher performance and higher levels of integration (for lower cost chips) persists.

Moreover, post Moore's law era, semiconductor manufacturing advancements and already shrunk FETs can no longer do the heavy lifting to improve IC's performance. As such, there is increased demand (as a matter of both priority and necessity) for efficiently arranged and designed signal processing chips and innovative circuit designs that not only occupy smaller die area, but also consume lower powers and have reasonable resolution, which is the objective of this invention.

SUMMARY OF THE INVENTION

Considering the above, it is the objective of the present disclosure to provide improvements to squarers and multipliers including (but not limited to) the following (in part or combination thereof):

An objective of this disclosure is to provide digital IC approximate squarer suitable for digital IC approximate computing.

Another objective of the present invention is to utilize digital IC approximate squaring to perform approximate multiplication by utilizing the quarter square method. Accordingly, digital IC multiplication can be performed by deducting the square of subtraction of two digital words (x, y) from the square of their summation as in $(x+y)^2 + (x-y)^2 = 4xy$.

Another objective of the present invention is to provide a digital IC approximate squarer and approximate multiplication functions whose degree of approximation can be pre-programed and or programmed real-time (on the fly) depending on the application and or different set of the real time data. In other words, for an application whose set of data needs more precision (less approximation), the approximate squarer and or approximate multiplier can be programmed on the fly to compute the squaring of the set data with less approximation. Conversely, in the same application whose another set of data needs less precision (more approximation), the approximate squarer and or multiplier may (on the fly) be programmed real-time differently to compute the squaring of the another set of data with more approximation, which can save on power consumption and computation speed. This would enable optimizing digital IC computation (pre-programmed or real-time programming) for precision versus speed versus power consumption versus cost, as required by the application and data-sets.

Another objective of this disclosure is to provide digital IC approximate squarer and approximate multiplier functions with less gate count which occupies smaller area and costs less.

Considering that generally in a digital chip the more gate counts the higher power consumption of the chip, another objective of this invention can provide the digital IC approximate squarer and multipliers having lower power consumption.

Another objective of this invention is to provide cost effective and low power digital IC approximate squaring and accumulating for cost sensitive and power sensitive machine learning and artificial intelligence applications.

Another objective of this invention is to provide a single or few asynchronous and synchronous digital IC approximate squarers and or approximate multipliers that can be time multiplexed or digitally shared so to generate many (plurality of) squaring and or multiplication functions.

Another objective of this invention is to provide asynchronous and synchronous digital IC approximate squaring and accumulating (SAC) for low-power and low cost-machine learning and artificial intelligence applications.

Utilizing the disclosed digital IC approximate squarer (through the quarter square method to perform approximate multiplication) another objective of this invention is to provide digital IC approximate multiplication and accumulating (MAC) for low-cost and low-power machine learning and artificial intelligence applications.

Utilizing the disclosed digital IC approximate squarer (through the quarter square method to perform approximate multiplication), another objective of this invention is to provide plurality of digital IC MACs that can be utilized in digital IC artificial neural networks (ANN) for low-cost and low-power machine learning and artificial intelligence applications.

Another objective of the present invention is to provide mixed-mode approximate squaring and or mixed-mode approximate multiplications, wherein the internal summation and or subtraction functions of the approximate squaring and or multiplication can be performed in analog and or mixed-mode (current-mode and or voltage mode). For example, plurality of outputs of approximate digital IC squarers or approximate digital IC multipliers can be inputted to plurality of current mode Digital-to-Analog-Converters (iDACs), wherein by the function of summation (e.g., adding two multiplications) can be performed simply by coupling together the current output terminals of plurality of iDACs.

Another objective of the present invention is to utilize mixed-mode approximate squarer and mixed-mode approximate multiplier in a mixed-mode approximate square and accumulate (SAC) and or multiply and accumulate (MAC), wherein the summation and subtraction functions of the SAC and MAC can be performed in analog or mixed mode (current-mode and or voltage mode).

An aspects of the embodiments disclosed herein include an approximate digital squaring (aSQR) method in a digital state machine in an integrated circuit, the method comprising: receiving an at least one input digital word ($D_i$), wherein the at least one $D_i$ has a digital value spanning from zero scale (ZS) to full scale (FS); programming at least one total number of digital interpolation steps (n); initializing each digital word of an at least one digital array O to zero, wherein each of the at least one digital array O is comprised of a plurality of digital words; initializing each digital word of an at least one digital array P to zero, wherein each of the at least one digital array P is comprised of a plurality of digital words; beginning at an at least one first digital interpolation step of j=1 and ending at a digital interpolation step of j=n, generating and storing an at least one sequence of digital words into the at least one digital array O respectively into digital words $O_j$ by adding: an at least one respective sequence of $2 \times \Sigma_{k=1}^{j-1} P_j$ digital words to an at least one respective sequence of $FS/2^j$ digital words, and subtracting the result of that addition from a respective at least one $D_i$ word, generating an at least one selected digital sequence by selecting a sequence of an at least one maximum of an at least one digital words $O_j$ and a digital zero word, and storing the at least one selected digital sequence into the at least one digital array P respectively into digital words $P_j$. Further aspect of the approximate digital squaring (aSQR) method in a digital state machine in an integrated circuit, the method further comprising: generating an at least one $S_n$ signal by respectively computing at least one summation $\Sigma_{j=1}^{n} P_j \times \frac{1}{2}^{(j-2)}$ at each of a summation step j beginning at a first summation step and ending at a summation step of n; and wherein the at least one $S_n$ signal is an approximate equivalent square of the at least one $D_i$ ($\sim D_i^2$). Further aspect of approximate digital squaring (aSQR) method in a digital state machine in an integrated circuit, the method further comprising: programming a plurality n of digital interpolation steps, real-time on the fly, generating a plurality of respective $S_n$ signals, real-time on the fly; and wherein the plurality of respective $S_n$ signals are the respective approximate equivalents of the respective squares of a plurality of the at least one $D_i$, corresponding respectively to the plurality of n digital interpolation steps. Further aspect of the approximate digital squaring (aSQR) method in a digital state machine in an integrated circuit, the method further comprising: performing the summation functions in computing the respective $\Sigma_{j=1}^{n} P_j \times \frac{1}{2}^{(j-2)}$ by utilizing at least one of an at least one digital adder and an at least one analog adder to generate the at least one $S_n$ signal; and wherein the at least one analog adder is comprised of an at least one Digital-to-Analog-Converter (DAC). Further aspect of the approximate digital squaring (aSQR) method in a digital state machine in an integrated circuit, the method further comprising: generating an at least one summing absolute value digital word ($|Di_s|$), wherein the at least one $|Di_s|$ digital word is an at least one summation of an at least two digital words (X+Y); generating an at least one deducting absolute value digital word ($|Di_d|$), wherein the at least one $|Di_d|$ digital word is an at least one subtraction of an at least two digital words (X-Y); generating an at least one summing approximate square signal ($S_{n_s}$), wherein $S_{n_s}$ is an approximate equivalence of the square of $|Di_s|(|Di_s|^2)$; and generating an at least one deducting approximate square signal ($S_{n_d}$), wherein $S_{n_d}$ is an approximate equivalence of the square of $|Di_d|(|Di_d|^2)$. Further aspect of the approximate digital squaring (aSQR) method in a digital state machine in an integrated circuit, the method further comprising: generating an at least one approximate multiplication signal ($\sim(4X \times Y)$) by subtracting the at least one $S_{n_d} \approx |Di_d|^2$ signal from the at least one $S_{n_s} \approx |Di_s|^2$ signal; performing the subtracting in computing the $\sim(4X \times Y)$ signal by utilizing at least one of an at least one digital subtractor and an at least one analog subtractor; and wherein the at least one analog subtractor is comprised of an at least one Digital-to-Analog-Converter (DAC). Further aspect of the approximate digital squaring (aSQR) method in a digital state machine in an integrated circuit, the method further comprising: generating an at least one plurality of approximate $\sim(4X \times Y)$ signals; generating an at least one approximate multiply-accumulate signal ($\Sigma \sim (4X \times Y)$) by combining more than the at least one plurality of approximate $\sim(4X \times Y)$ signals; generating an at least one offset signal (B); generating an at least one offsetting approximate multiply-accumulate signal ($\Sigma \sim (4X \times Y)+B$) by combining the at least one approximate $\Sigma \sim (4X \times Y)$ analog signal with the at least one B signal. Further aspect of the approximate digital squaring (aSQR) method in a digital state machine in an integrated circuit, the method further comprising: combining an at least one plurality of the $\Sigma \sim (4X \times Y)+B$ signal to arrange an at least one artificial neural network (ANN).

Another aspects of the embodiments disclosed herein include an approximate digital squaring (a'SQR) method in a digital state machine in an integrated circuit, the method comprising: receiving at least one input digital word ($D_i$), wherein the at least one $D_i$ has a digital value spanning from zero scale (ZS) to full scale (FS); subtracting an at least one digital word having a value of one half of FS from the at least one $D_i$ digital word to generate an at least one first offset digital word ($O_1$), wherein $O_1 = D_i - F \times 2^{-1}$; selecting an at least one first maximum of the at least one $O_1$ digital word, and an at least a digital word having a value of ZS, to generate an at least one first positive digital word ($P_1$), wherein $P_1 = \max(O_1, ZS)$; subtracting the sum of 2 times the at least one $P_1$ digital word and an at least one digital word having a value of $\frac{1}{4}^{th}$ of FS from the at least one $D_i$ digital word to generate an at least one second offset digital word ($O_2$), wherein $O_2 = D_i - (FS \times 2^{-2} + 2 \times P_1)$; and selecting an at least one second maximum of the at least one $O_2$ digital word and an at least one digital word having a value of ZS to generate an at least one second positive digital word ($P_2$), wherein $P_2 = \max(O_2, ZS)$. Further aspect of The approximate digital squaring (a'SQR) method in a digital state machine in an integrated circuit, the method further comprising: generating at least one $S_2$ signal, wherein $S_2 = 2^1 \times P_1 + 2^0 \times P_2 \approx D_{i2}^2$; and wherein the at least one $S_2$ signal represents an at least one square approximation of the at least one $D_i$ ($\sim D_{i2}^2$). Another aspect of the approximate digital squaring (a'SQR) method in a digital state machine in an integrated circuit, the method further comprising: subtracting the sum of 2 times the at least one $P_1$ digital word, 2 times the at least one $P_2$ digital word, and an at least one digital word having a value of $\frac{1}{8}^{th}$ of FS from the at least one $D_i$ digital word to generate an at least one third offset digital word ($O_3$), wherein $O_3 = D_i - (FS \times 2^{-2} + 2 \times P_1 + 2 \times P_2)$; and selecting an at least one third maximum of the at least one $O_3$ digital word and an at least one digital word having a value of ZS to generate an at least one third positive digital word ($P_3$), wherein $P_3 = \max(O_3, ZS)$. Further aspect of the approximate digital squaring (a'SQR) method in a digital state machine in an integrated circuit, the method further comprising: generating at least one $S_3$, wherein $S_3 = 2^1 \times P_1 + 2^0 \times P_2 + 2^{-1} \times P_3 \approx D_{i3}^2$; and wherein the at least one $S_3$ signal represent an at least one square approximation of the at least one $D_i$ ($\sim D_{i3}^2$). Another aspect of the approximate digital squaring (a'SQR) method in a digital state machine in an integrated circuit, the method further comprising: subtracting the sum of 2 times the at least one $P_1$ digital word, 2 times the at least one $P_2$ digital word, 2 times the at least one $P_3$, and an at least one digital word having a value of $\frac{1}{16}^{th}$ of FS from the at least one $D_i$ digital word to generate an at least one fourth offset digital word ($O_4$), wherein $O_4 = D_i - (FS \times 2^{-2} + 2 \times P_1 + 2 \times P_2 + 2 \times P_3)$; and selecting an at least one fourth maximum of the at least one $O_4$ digital word and an at least one digital word having a value of ZS to generate an at least one fourth positive digital word ($P_4$), wherein $P_4 = \max(O_4, ZS)$. Further aspect of the approximate digital squaring (a'SQR) method in a digital state machine in an integrated circuit, the method further comprising: generating at least one $S_4$, wherein $S_4 = 2^1 \times P_1 + 2^0 \times P_2 + 2^{-1} \times P_3 + 2^{-2} \times P_4 \approx D_{i4}^2$; and wherein the at least one $S_4$ signal represent an at least one square approximation of the at least one $D_i$ ($\sim D_{i4}^2$). Another aspect of the approximate digital squaring (a'SQR) method in a digital state machine in an integrated circuit, the method further comprising: subtracting the sum of 2 times the at least one $P_1$ digital word, 2 times the at least one $P_2$ digital word, 2 times the at least one $P_3$, 2 times the at least one $P_4$, and an at least one digital word having a value of $\frac{1}{32}^{nd}$ of FS from the at least one $D_i$ digital word to generate an at least one fifth offset digital word ($O_5$), wherein $O_5 = D_i - (FS \times 2^{-2} + 2 \times P_1 + 2 \times P_2 + 2 \times P_3 + 2 \times P_4)$; and an at least one fourth maximum of the at least one $O_5$ digital word and an at least one digital word having a value of ZS to generate an at least one fifth positive digital word ($P_5$), wherein $P_5 = \max(O_5, ZS)$. Further aspect of the approximate digital squaring (a'SQR) method in a digital state machine in an integrated circuit, the method further comprising: generating an at least one $S_5$, wherein $S_5 = 2^1 \times P_1 + 2^0 \times P_2 + 2^{-1} \times P_3 + 2^{-2} \times P_4 + 2^{-3} \times P_5 \approx D_{i5}^2$; and wherein the at least one $S_5$ signal represent an at least one square approximation of the at least one $D_i$ ($\sim D_{i5}^2$). Further aspect of the approximate digital squaring (a'SQR) method in a digital state machine in an integrated circuit, the method further comprising: subtracting the sum of 2 times the at least one $P_1$ digital word, 2 times the at least one $P_2$ digital word, 2 times the at least one $P_3$, 2 times the at least one $P_4$, 2 times the at least one $P_5$, and an at least one digital word having a value of $\frac{1}{64}^{th}$ of FS from the at least one $D_i$ digital word to generate an at least one sixth offset digital word ($O_6$), wherein $O_6 = D_i - (FS \times 2^{-2} + 2 \times P_1 + 2 \times P_2 + 2 \times P_3 + 2 \times P_4 + 2 \times P_5)$; and selecting an at least one fourth maximum of the at least one $O_6$ digital word and an at least one digital word having value of ZS to generate an at least one sixth positive digital word ($P_6$), wherein $P_6 = \max(O_6, ZS)$. Further aspect of the approximate digital squaring (a'SQR) method in a digital state machine in an integrated circuit, the method further comprising: generating an at least one $S_6$, wherein $S_6 = 2^1 \times P_1 + 2^0 \times P_2 + 2^{-1} \times P_3 + 2^{-2} \times P_4 + 2^{-3} \times P_5 + 2^{-4} \times P_6 \approx D_{i6}^2$; and wherein the at least one $S_6$ signal represent an at least one square approximation of the at least one $D_i$ ($\sim D_{i6}^2$). Further aspect of the approximate digital squaring (a'SQR) method of in a digital state machine in an integrated circuit, the method further comprising: generating an at least one of $S_2$, $S_3$, $S_4$, $S_5$, and $S_6$; wherein $S_2 = 2^1 \times P_1 + 2^0 \times P_2 \approx D_{i2}^2$; wherein $S_3 = 2^1 \times P_1 + 2^0 \times P_2 + 2^{-1} \times P_3 \approx D_{i3}^2$; wherein $S_4 = 2^1 \times P_1 + 2^0 \times P_2 + 2^{-1} \times P_3 + 2^{-2} \times P_4 \approx D_{i4}^2$; wherein $S_5 = 2^1 \times P_1 + 2^0 \times P_2 + 2^{-1} \times P_3 + 2^{-2} \times P_4 + 2^{-3} \times P_5 \approx D_{i5}^2$; wherein $S_6 = 2^1 \times P_1 + 2^0 \times P_2 + 2^{-1} \times P_3 + 2^{-2} \times P_4 + 2^{-3} \times P_5 + 2^{-4} \times P_6 \approx D_{i6}^2$; wherein the summing of the at least one of $P_1$ through $P_6$ digital words is performed by at least one digital adder and converting the at least one of $P_1$ through $P_6$ digital words to analog by at least one of digital-to-analog converter (DAC) wherein the outputs of the more than one of the at least one DACs are summed together in analog; and wherein the at least one $S_2 \approx D_{i2}^2$, $S_3 \approx D_{i3}^2$, $S_4 \approx D_{i4}^2$, $S_5 \approx D_{i5}^2$, and $S_6 \approx D_{i6}^2$ signals represent an at least one square approximation of the at least one $D_i$.

Another aspects of the embodiments disclosed herein include an approximate digital squaring (a"SQR) method in a digital state machine in an integrated circuit, the method comprising: receiving at least one input digital word ($D_i$), wherein the at least one $D_i$ has a digital value spanning from zero scale (ZS) to full scale (FS); receiving a total number of digital interpolation steps (n); programming a digital state machine to cycle a plurality (j) of steps, wherein the cycle starts at a first step and increments up to n steps; initializing a first digital array (P) to zero scale, wherein the first digital array P is comprised of a plurality of digital words ($P_j$); initializing a second digital array (O) to zero scale; wherein the second digital array O is comprised of a plurality of digital words ($O_j$); looping the digital state machine to perform the following cycle of the plurality (j) of steps: a first step $$O_j = 2 \times \sum_{k=1}^{j-1} P_j + \left(\frac{1}{2}\right)^j \times FS;$$

then save $O_j$ digital word value; next $P_j = \max(ZS, O_j)$; then save $P_j$ digital word value; next if $j<n$, then increment j by 1 and return to the first step; otherwise if $j=n$, then exit the loop; after exiting the loop then generating a summation digital word $S_n = \sum_{j=1}^{n}(P_j \times \frac{1}{2}^{(j-2)})$; and wherein $S_n$ is an approximate digital representation of the square of $D_i$ ($\sim D_i^2$).

BRIEF DESCRIPTION OF THE DRAWINGS

The subject matter presented herein is illustrated by way of example, and not by way of limitation, in the figures of the accompanying drawings and illustrations, and in which like reference numerals refer to similar elements, and in which:

FIG. 1A' is a flow chart illustrating an approximate square method (aSQR) that can be utilized in an asynchronous (clock-free) arrangement.

FIG. 1A" is a circuit simulation showing the relation between the number of interpolation and the error (i.e., deviation from an ideal square) attributed to the aSQR method (illustrated in FIGS. 1A and 1A').

FIG. 1B' is the logic block diagram for a 1-bit digital full adder of FIG. 1B.

DETAILED DESCRIPTION

Numerous embodiments are described in the present application and are presented for illustrative purposes only and is not intended to be exhaustive. The embodiments were chosen and described to explain principles of operation and their practical applications. The present disclosure is not a literal description of all embodiments of the disclosure(s). The described embodiments also are not, and are not intended to be, limiting in any sense. One of ordinary skill in the art will recognize that the disclosed embodiment(s) may be practiced with various modifications and alterations, such as structural, logical, and electrical modifications. For example, the present disclosure is not a listing of features which must necessarily be present in all embodiments. On the contrary, a variety of components are described to illustrate the wide variety of possible embodiments of the present disclosure(s). Although particular features of the disclosed embodiments may be described with reference to one or more particular embodiments and/or drawings, it should be understood that such features are not limited to usage in the one or more particular embodiments or drawings with reference to which they are described, unless expressly specified otherwise. The scope of the disclosure is to be defined by the claims.

Although process (or method) steps may be described or claimed in a particular sequential order, such processes may be configured to work in different orders. In other words, any sequence or order of steps that may be explicitly described or claimed does not necessarily indicate a requirement that the steps be performed in that order. The steps of processes described herein may be performed in any order possible. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the embodiment(s). In addition, although a process may be described as including a plurality of steps, that does not imply that all or any of the steps are essential or required. Various other embodiments within the scope of the described disclosure(s) include other processes that omit some or all of the described steps. In addition, although a circuit may be described as including a plurality of components, aspects, steps, qualities, characteristics and/or features, that does not indicate that any or all of the plurality are essential or required. Various other embodiments may include other circuit elements or limitations that omit some or all of the described plurality.

Throughout this disclosure, the terms FET is field-effect-transistor; MOS is metal-oxide-semiconductor; MOSFET is MOS FET; PMOS is p-channel MOS; NMOS is n-channel MOS; BiCMOS is bipolar CMOS; LSP of a signal is the Least-Significant-Portion of the signal; MSP of the signal is the Most-Significant-Portion of the signal; and the sum of the MSP of the signal plus the LSP of the signals is equal to the whole signal; and the MSP or LSP can be represented in analog or digital form or combination thereof; MSB is Most-Significant-Bit and LSB is Least-Significant-Bit; SPICE is Simulation Program with Integrated Circuit Emphasis which is an industry standard circuit simulation program; micro is µ which is $10^{-6}$; nano is n which is $10^{-9}$; and pico is p which is $10^{-12}$. Bear in mind that $V_{DD}$ (as a positive power supply) and $V_{SS}$ (as a negative power supply) are applied to all the circuitries, block, or systems in this disclosure, but may not be shown for clarity of illustrations. The $V_{SS}$ may be connected to a negative power supply or to the ground (zero) potential. Body terminal of MOSFETs can be connected to their respective source terminals or to the MOSFET's respective power supplies, $V_{DD}$ and $V_{SS}$.

Keep in mind that for descriptive clarity, illustrations of the disclosed inventions are simplified, and their improvements beyond simple illustrations would be obvious to one skilled in the arts.

Figure 1A:
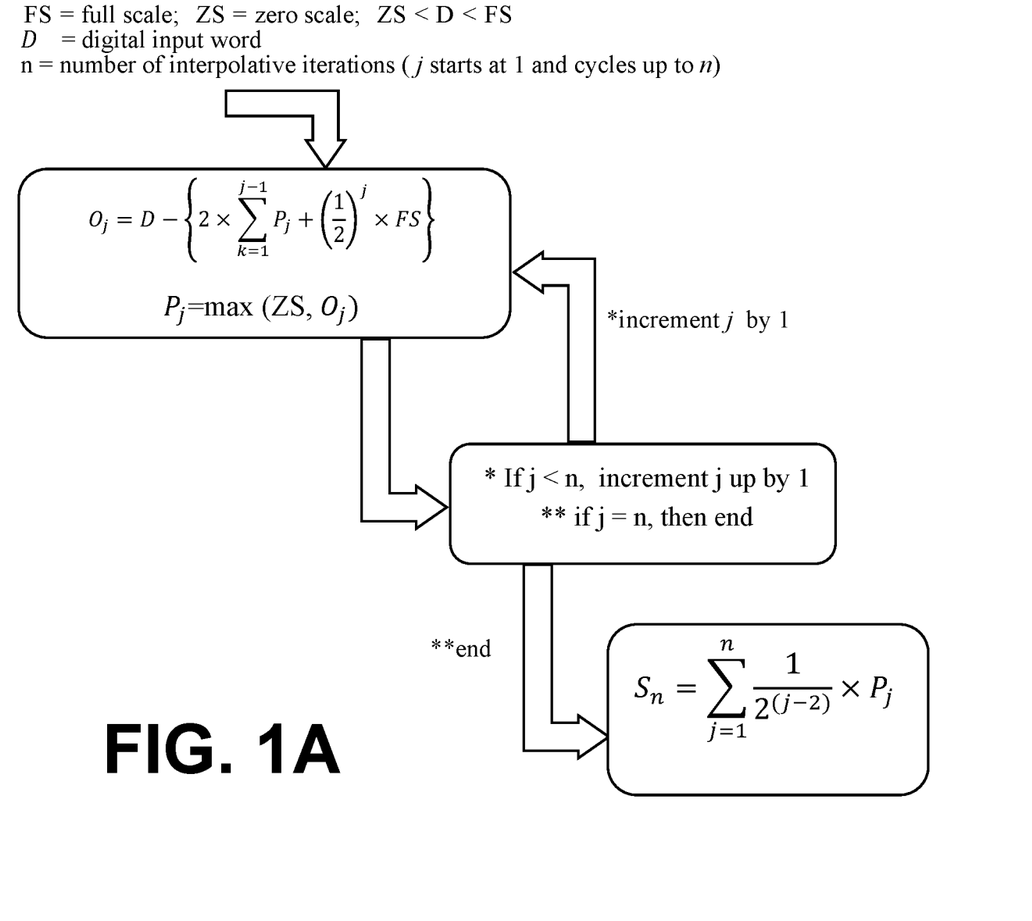
FIG. 1A is a flow chart illustrating an approximate square method (aSQR) that can be utilized in a synchronous arrangement.

Section 1A—Description of FIG. 1A

FIG. 1A is a flow chart illustrating an approximate square method (aSQR) that can be utilized in a synchronous arrangement. The aSQR method can be implemented utilizing a digital IC state machine in a following manner. With a digital input word $D_i$ that spans from zero scale=ZS to full scale=FS, the digital IC state machine arranged in accordance with the aSQR method can generate a digital word $S_n$ which is an approximate square representation of $D_i$. The precision of $S_n$ (i.e., the degree of squarer approximation) can be pre-programmed or programmed into the digital IC state machine in real-time (on the fly) by n that is the number of times (or the interpolations) the aSQR method is cycled (or time-multiplied) through. Intermediate digital words $O_j$ and $P_j$ are generated, via the digital IC state machine, in a sequence of n-cycles as follows: $O_j = D_i - \Sigma_{k=1}^{j-1} 2P_j - FS/2^j$ wherein j loops up to n times and wherein $P_j = abs(O_j) + O_j/2$. The generated $P_j$ are scaled binarily sequentially and added together according to $S_n = \Sigma_{j=1}^{n} P_j/2^{(j-2)}$.

In section A1' and FIG. 1A" the precision of an approximate squarer's digital IC (arranged by a state machine in accordance with the aSQR method) as a function of n will be described. Bear in mind that multiplying or dividing a number in the digital domain is a shift to the right or left respectively, which takes a small die area and inexpensive.

Some of the benefits of the aSQR method operating synchronously is summarized below:

First, the aSQR method enables a digital IC state machine to perform on-the fly or pre-programming of precision versus power consumption, and speed of an approximate squarer. The lower the precision requirement, the faster the squaring and the lower the power consumption per the squaring operation. As such, the precision of squarer approximation can be traded off with cost, speed, and power consumption depending on application cots-performance objectives.

Second, relatively speaking while addition (subtraction) occupy a large area in the digital domain, a digital IC state machine arranged in accordance with the disclosed aSQR method utilizes fewer adders compared to conventional digital IC squarers. Instead, the disclosed aSQR method requires functions such as multiply or divide by two, that can be implemented by a simple shift to the right or left in the digital domain, which takes a small die area. Moreover, the aSQR method utilizes functions such as adding or subtracting a fixed digital value (in proportion to an input digital word's full scale), which also take a relatively small area.

Third, the disclosed digital IC approximate squaring can be arranged to perform approximate multiplication by utilizing the quarter square method. Accordingly, digital IC multiplication can be performed by deducting the square of subtraction of two digital words (x, y) from the square of their summation as in $(x+y)^2+(x-y)^2=4xy$.

Fourth, the disclosed digital IC approximate squaring can be arranged, in the back-end, to performed square and accumulate (SAC) and multiply and accumulate (MAC) functions in mixed-mode. For example, plurality of outputs of approximate digital IC squarers or approximate digital IC multipliers can be inputted to plurality of current mode Digital-to-Analog-Converters (iDACs), wherein by the function of summation (e.g., adding two multiplications) can be performed simply by coupling together the current output terminals of plurality of iDACs.

Section 1A'—Description of FIG. 1A'

FIG. 1A' is a flow chart illustrating an approximate square method (aSQR) that can be utilized in an asynchronous (clock-free) arrangement. Utilizing a state machine in a digital IC that is arranged in accordance with the aSQR method, through a series (n) of interpolation (without a clock), a digital word $D_i$ can be approximately squared ($\sim D_i^2 = S_n$) wherein the accuracy of the $\sim D_i^2 = S_n$ digital word can be increased with more n interpolations. For example, two interpolations generate an approximate squared digital word $S_2$ whereas n interpolations generate an approximate squared digital word $S_n$, wherein $S_2$ is less precise than $S_n$. Generally speaking, the less the interpolations (small n), the less the precision of the approximate square results. But fewer interpolations can be done faster with less power consumption and less logic gate count (cheaper). This feature of the aSQR method would enable the end application to pre-program and optimize the approximate squaring function in accordance with cost-performance objectives. As noted in the previous section, for cost sensitive applications the aSQR method can be utilized synchronously where an approximate squarer function is re-used in a time-multiplexed loop through a sequence of cycles (i.e., n-times). Conversely, for speed sensitive applications, the aSQR method can be utilized asynchronously (clock-free) through a series of n interpolations implemented in combinational logic. In the proceeding description, note that the range of the $D_i$ digital word is from zero-scale (ZS) with all zero bits to full-scale (FS) with all one bit.

In FIG. 1A' the respective series of n asyncnhronous interpolations, based on the aSQR method, are described:

In the first interpolation (n=1), the $D_i$ word is shifted by half of full-scale to arrange a digital word $O_1$ which is a $D_i$ word that is digitally offset by half of FS. As such, $O_1=D_i-FS\times2^{-1}$. Then, a maximum of the $O_1$ word and zero-scale is selected that outputs a $P_1$ digital word which is a positive word $P_1=\max(O_1, ZS)$. Accordingly, the $P_1$ word represents the positive portion of the $D_i$ word above ½ of FS.

In the second interpolation (n=2) stage, the $D_i$ word is shifted by a sum of $2\times P_1$ word and a quarter of full-scale to generate a digital word $O_2$ which is a $D_i$ word that is offset down by $FS\times2^{-2}+2\times P_1$. That is to say $O_2=D_i-(FS\times2^{-2}+2\times P_1)$. Then, a maximum of the $O_2$ word and zero-scale is selected that generates a $P_2$ word which is a positive word with respect to zero-scale or $P_2=\max(O_2, ZS)$. Accordingly, the $P_2$ word represents the positive portion of the $D_i$ word above the sum of ¼ of FS and $2\times P_1$ word. Here at the second interpolation point, an approximate squared digital word $S_2=D_{i2}^2$ (that is an approximate representation of the square of the $D_i$ word) is be generated by summing the binarily scaled $P_1$ and $P_2$ words. Stated mathematically, $D_i^2 \approx S_2 = D_{i2}^2 = 2^1 \times P_1 + 2^0 \times P_2$. As depicted in FIG. 1A'', notice that with two interpolations (n=2) the $S_2 = D_{i2}^2$ word is ~93.6% accurate as compared to ideal $D_i^2$ (with ~6.4% error).

When a squarer with greater than 93.6% of precision is required, another interpolation (n=3) can be implemented in accordance to the aSQR method. In the third interpolation stage, the $D_i$ word is shifted by a sum of $2\times(P_1+P_2)$ word and one eighth of full-scale to generate a digital word $O_3$ which is a $D_i$ word that is offset by $FS\times2^{-3}+2\times(P_1+P_2)$. That is to say $O_3=D_i-\{FS\times2^{-3}+2\times(P_1+P_2)\}$. Then, the maximum of the $O_3$ word and zero-scale is selected which generates a $P_3$ word that is a positive word with respect to zero-scale or $P_3=\max(O_3, ZS)$. Accordingly, the $P_3$ word represents the positive portion of the $D_i$ word above the sum of ⅛ of FS and $2\times(P_1+P_2)$ word. Here at the third interpolation point, an approximate squared digital word $S_3=D_{i3}^2$ (that is an approximate representation of the square of the $D_i$ word) is be generated by summing the binarily proportioned $P_1$, $P_2$, and $P_3$ words. Stated mathematically, $D_i^2 \approx S_3 = D_{i3}^2 = 2^1 \times P_1 + 2^0 \times P_2 + 2^{-1} \times P_3 \approx D_{i3}^2$. As depicted in FIG. 1A'', notice that with three interpolations (n=3) the $S_3=D_{i3}^2$ word is ~98.4% accurate as compared to ideal $D_i^2$ (with ~1.6% error).

Where a squarer with greater than 98.4 of precision is required, another interpolation (n=4) can be implemented in accordance to the aSQR method. In the fourth interpolation stage, the $D_i$ word is shifted by a sum of $2\times(P_1+P_2+P_3)$ word and one sixteenth of full-scale to arrange a digital word $O_4$ which is a $D_i$ word that is offset by $FS\times2^{-4}+2\times(P_1+P_2+P_3)$. Put differently, $O_4=D_i-\{FS\times2^{-4}+2\times(P_1+P_2+P_3)\}$. Then, a maximum of the $O_4$ word and zero-scale is selected that generates a $P_4$ word which is a positive word with respect to zero-scale or $P_4=\max(O_4, ZS)$. Accordingly, the $P_4$ word represents the positive portion of the $D_i$ word above the sum of 1/16 of FS and $2\times(P_1+P_2+P_3)$ word. Here again at the fourth interpolation point, an approximate squared digital word $S_4=D_{i4}^2$ (that is an approximate representation of the square of the $D_i$ word) is be generated by summing binarily proportioned $P_1$, $P_2$, $P_3$, and $P_4$ words. Stated mathematically, $D_i^2 \approx S_4 = D_{i4}^2 = 2^1 \times P_1 + 2^0 \times P_2 + 2^{-1} \times P_3 + 2^{-2} \times P_4$. As depicted in FIG. 1A'', notice that with four interpolations (n=4) the $S_4=D_{i4}^2$ word is ~99.6% accurate as compared to ideal $D_i^2$ (with ~0.4% error).

Again, if an approximate squarer with higher precision than 0.4% (accurate to ~8-bits) is required, another interpolation (n=5) can be implemented in accordance to the aSQR method. As such, the $D_i$ word can be shifted by a sum of $2\times(P_1+P_2+P_3+P_4)$ words and 1/32 of full-scale to arrange a digital word $O_5$ which is a $D_i$ word that is offset by $FS\times2^{-5}+2\times(P_1+P_2+P_3+P_4)$. Said differently, $O_5=D_i-\{FS\times2^{-5}+2\times(P_1+P_2+P_3+P_4)\}$. Then, a maximum of the $O_5$ word and zero-scale is selected that generates a $P_5$ word which is a positive word with respect to zero-scale or $P_5=\max(O_5, ZS)$. Accordingly, the $P_5$ word represents the positive portion of the $D_i$ word above the sum of 1/32 of FS and $2\times(P_1+P_2+P_3+P_4)$ word. Here again, an approximate squared digital word $S_5=D_{i5}^2$ can be arranged by summing binarily proportioned $P_1$, $P_2$, $P_3$, $P_4$, and $P_5$ words, wherein $S_5=D_{i5}^2$ word is an approximate representation of the square of the $D_i$ word. Stated mathematically, $D_i^2 \approx S_5 = D_{i5}^2 = 2^1 \times P_1 + 2^0 \times P_2 + 2^{-1} \times P_3 + 2^{-2} \times P_4 + 2^{-3} \times P_5$. As depicted in FIG. 1A'', with five interpolations (n=5), observe that $S_5=D_{i5}^2$ word is ~99.9% accurate as compared to ideal $D_i^2$ (with ~0.1% error).

Similarly, if an approximate squarer with better than ~0.1% precision (accuracy of ~10-bits) is needed, another interpolation (n=6) can be implemented in accordance to the aSQR method. As such, the $D_i$ word is shifted by a sum of $2\times(P_1+P_2+P_3+P_4+P_5)$ words and $\frac{1}{64}$ of full-scale to arrange a digital word $O_6$ which is a $D_i$ word that is offset by $FS\times2^{-6}+2\times(P_1+P_2+P_3+P_4+P_5)$. Stated differently, $O_6=D_i-\{FS\times2^{-6}+2\times(P_1+P_2+P_3+P_4+P_5)\}$. Then, a maximum of the $O_6$ word and zero-scale is selected that generates a $P_6$ word which is a positive word with respect to zero-scale or $P_6=\max(O_6, ZS)$. Accordingly, the $P_6$ word represents the positive portion of the $D_i$ word above the sum of $\frac{1}{64}$ of FS and $2\times(P_1+P_2+P_3+P_4+P_5)$ words. Here again at the sixth interpolation point, an approximate squared digital word $S_6=D_{i6}^2$ (that is an approximate representation of the square of the $D_i$ word) is be generated by summing binarily proportioned $P_1$, $P_2$, $P_3$, $P_4$, and $P_5$ words. Stated mathematically, $D_i^2 \approx S_5 = D_{i5}^2 = 2^1 \times P_1^0 \times P_2 + 2^{-1} \times P_3 + 2^{-2} \times P_4 + 2^{-3} \times P_5 + 2^{-4} \times P_6$. As depicted in FIG. 1A", with six interpolations (n=6), observe that $S_6=D_{i6}^2$ word is ~99.975% accurate as compared to ideal $D_i^2$ (with ~0.025% error).

Form the above description, it becomes clear that if an approximate squarer with better than ~0.025% precision (accuracy of ~12-bits) is needed, then more interpolation (n>6) can be implemented in accordance to the aSQR method.

In summary, the benefits of:

First, full adders occupy large area in the digital domain, generally speaking. The aSQR method can be implemented in the digital domain with fewer adders (compared to a conventional digital squarer) which makes it more area efficient.

Second, implementing the aSQR method requires a number multiply or divide by two operations which can be implemented inexpensively in the digital domain by a shift right or left operation, respectively.

Third, utilizing the aSQR method having more interpolations, the peak-to-peak digital value of sequential $P_i$ digital words diminish, which can help reduced the overall logic gate-count of its implementation.

Fourth, the aSQR method generates a number of points (digital words) that exactly (represent) fit the square function, and linearly interpolates in-between those points. The larger the number of interpolation (n), the greater number of points that exactly fit an ideal square function and thus the less the error associated with linearly interpolating in between those exact fit points.

Fifth, fewer gates in a digital circuit generally go hand-in-hand with lower dynamic power consumption and faster speed. As such, since the aSQR method requires fewer gates for implementing a square function, it can function with higher speed and lower dynamic power consumption compared to convocational digital IC squarer implementations, for a given resolution.

Sixth, the disclosed digital IC approximate squaring can be arranged to perform approximate multiplication by utilizing the quarter square method. Accordingly, digital IC multiplication can be performed by deducting the square of subtraction of two digital words (x, y) from the square of their summation as in $(x+y)^2+(x-y)^2=4xy$.

Seventh, the disclosed digital IC approximate squaring can be arranged to performed square and accumulate (SAC) and multiply and accumulate (MAC) functions in mixed-mode. For example, plurality of outputs of approximate digital IC squarers or approximate digital IC multipliers can be inputted to plurality of current mode Digital-to-Analog-Converters (iDACs), wherein by the function of summation (e.g., adding two multiplications) can be performed simply by coupling together the current output terminals of plurality of iDACs.

Section 1A"—Description of FIG. 1A"

FIG. 1A" is a circuit simulation showing the relation between the number of interpolation and the error (i.e., deviation from an ideal square) attributed to the aSQR method (illustrated in FIGS. 1A and 1A'). Bear in mind that the illustrated simulations here is intended to further clarify the disclosed aSQR method and not as a limitation on the performance of the disclosed aSQR method.

The horizontal axis shows the digital input word Di spanning from zero scale (ZS) at zero milli-seconds (ms) to full scale (FS) at 10 ms.

The vertical axis shows the percent (%) of inaccuracy of the squarer approximation ($S_2$ to $S_6$) as compared to an ideal square ($D_i$).

Bear in mind that for sake of clarity (e.g., avoid overlapping graphs), some of the error waveforms in the upper and lower graphs of FIG. 1A" are added an artificial offset.

The lower part of FIG. 1A" depicts simulated precision of aSQR method with n=2 interpolation having an error of about 6.4% for $S_2$–$Di^2$ (offset by 0.4%), with n=3 interpolation having an error of about 1.6% for $S_3$–$Di^2$ (offset by 0.2%), and with n=4 interpolation having an error of about 0.4% for $S_4$–$Di^2$.

The upper part of FIG. 1A" depicts simulated precision of aSQR method with n=5 interpolation having an error of about 0.1% for $S_5$–$Di^2$ (offset by 0.01%), and with n=6 interpolation having an error of about 1.6% for $S_3$–$Di^2$ (offset by 0.2%).

Figure 1B:
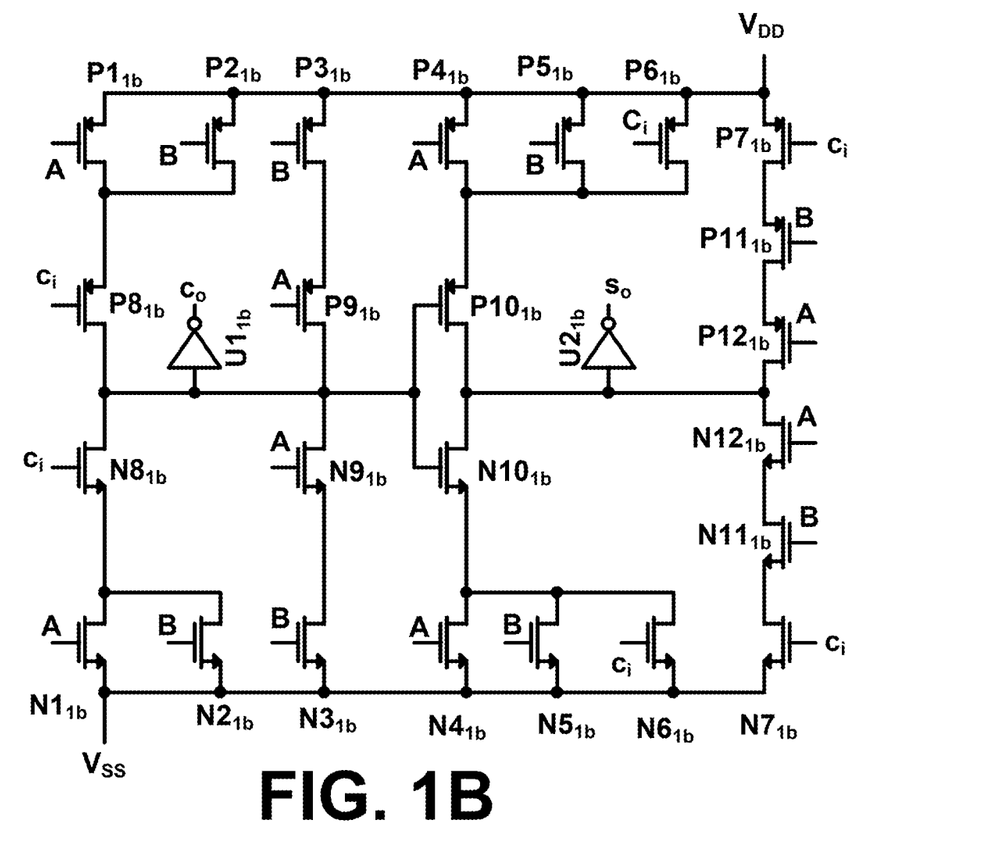
FIG. 1B is a circuit schematic for a 1-bit digital full adder.

Section 1B & 1B'—Description of FIGS. 1B & 1B'

FIGS. 1B and 1B' are transistor level and block diagram for a 1-bit digital IC full adder, respectively.

The A and B are 1-bit wide digital input ports, Ci is the carry-in 1-bit port port, So is the summation output 1-bit port, and Co is the carry-out 1-bit port.

Figure 1C:
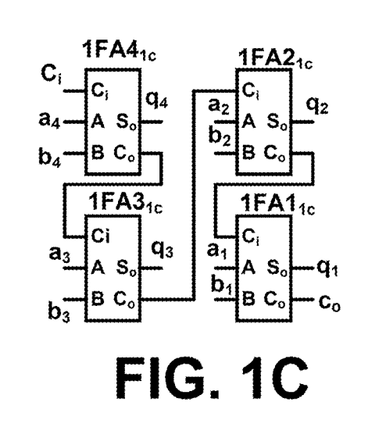
FIG. 1C is a logic diagram for a 4-bit wide digital full adder, comprised of four of the 1-bit wide full adders disclosed in FIG. 1B and FIG. 1B'.
Figure 1D:
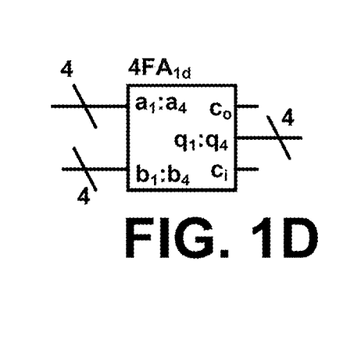
FIG. 1D is a block diagram of the 4-bit wide full-adder of FIG. 1C.

Section 1C & 1D—Description of FIGS. 1C & 1D

FIG. 1C is a logic diagram for a 4-bit wide digital IC full adder, comprised of four of the 1-bit wide full adders disclosed in FIG. 1B and FIG. 1B'. FIG. 1D is a block diagram of the 4-bit wide full-adder of FIG. 1C.

The a1 to a4 (a1:a4) are the first 4-bit wide input port and b1 to b4 (b1:b4) are the second 4-bit wide input port of the 4-bit wide full adder of FIG. 1C and FIG. 1D. The q1 to q4 (q1:q4) are the 4-bit wide output port, Ci is the carry-in 1-bit port, and Co is the carry-out 1-bit port of the 4-bit full adder of FIG. 1C and FIG. 1D.

Figure 1E:
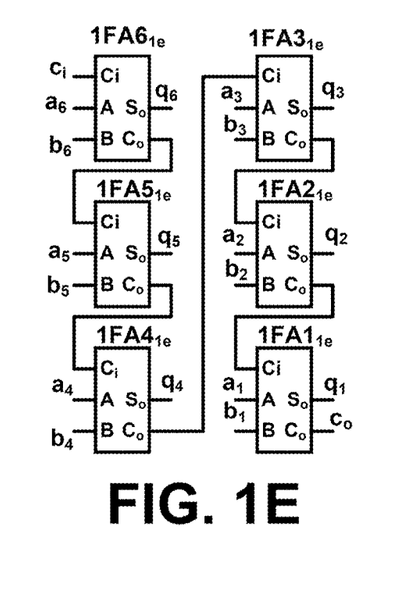
FIG. 1E is a logic diagram for a 6-bit wide digital full adder, comprised of six of the 1-bit wide full adders disclosed in FIG. 1B and FIG. 1B'.
Figure 1F:
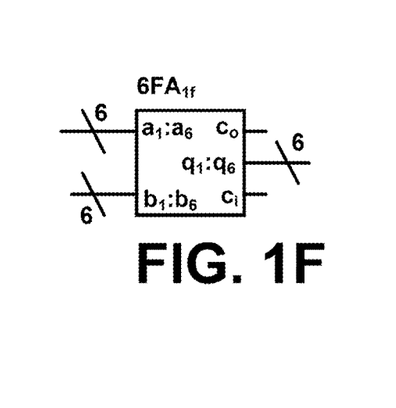
FIG. 1F is a block diagram of the 6-bit wide full-adder of FIG. 1E.

Section 1E & 1F—Description of FIGS. 1E & 1F

FIG. 1E is a logic diagram for a 6-bit wide digital IC full adder, comprised of six of the 1-bit wide full adders disclosed in FIG. 1B and FIG. 1B'. FIG. 1F is a block diagram of the 6-bit wide full-adder of FIG. 1E.

The a1 to a6 (a1:a6) are the first 6-bit wide input port and b1 to b6 (b1:b6) are the second 6-bit wide input port of the 6-bit wide full adder of FIG. 1E and FIG. 1F. The q1 to q6 (q1:q6) are the 6-bit wide output port, Ci is the carry-in 1-bit port, and Co is the carry-out 1-bit port of the 6-bit full adder of FIG. 1E and FIG. 1F.

13

Figure 1G:
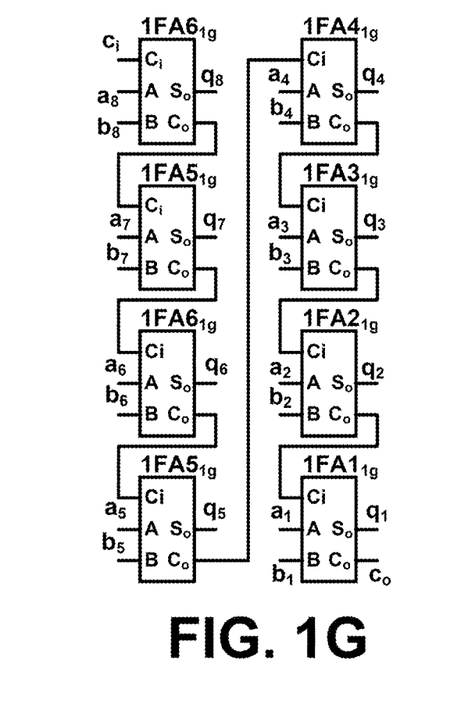
FIG. 1G is a logic diagram for an 8-bit wide digital full adder, comprised of six of the 1-bit wide full adders disclosed in FIG. 1B and FIG. 1B'.
Figure 1H:
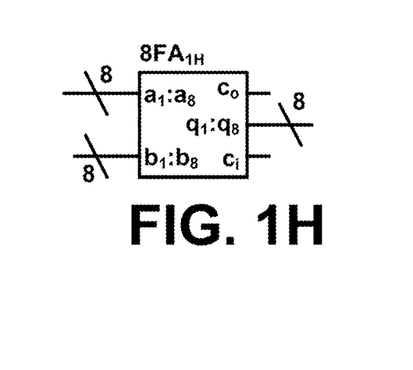
FIG. 1H is a block diagram of the 8-bit wide full-adder of FIG. 1G.

Section 1G & 1H—Description of FIGS. 1G & 1H

FIG. 1G is a logic diagram for an 8-bit wide digital IC full adder, comprised of six of the 1-bit wide full adders disclosed in FIG. 1B and FIG. 1B'. FIG. 1H is a block diagram of the 8-bit wide full-adder of FIG. 1G.

The a1 to a8 (a1:a8) are the first 8-bit wide input port and b1 to b8 (b1:b8) are the second 8-bit wide input port of the 8-bit wide full adder of FIG. 1G and FIG. 1H. The q1 to q8 (q1:q8) are the 8-bit wide output port, Ci is the carry-in 1-bit port, and Co is the carry-out 1-bit port of the 8-bit wide full adder of FIG. 1G and FIG. 1H.

Figure 2A:
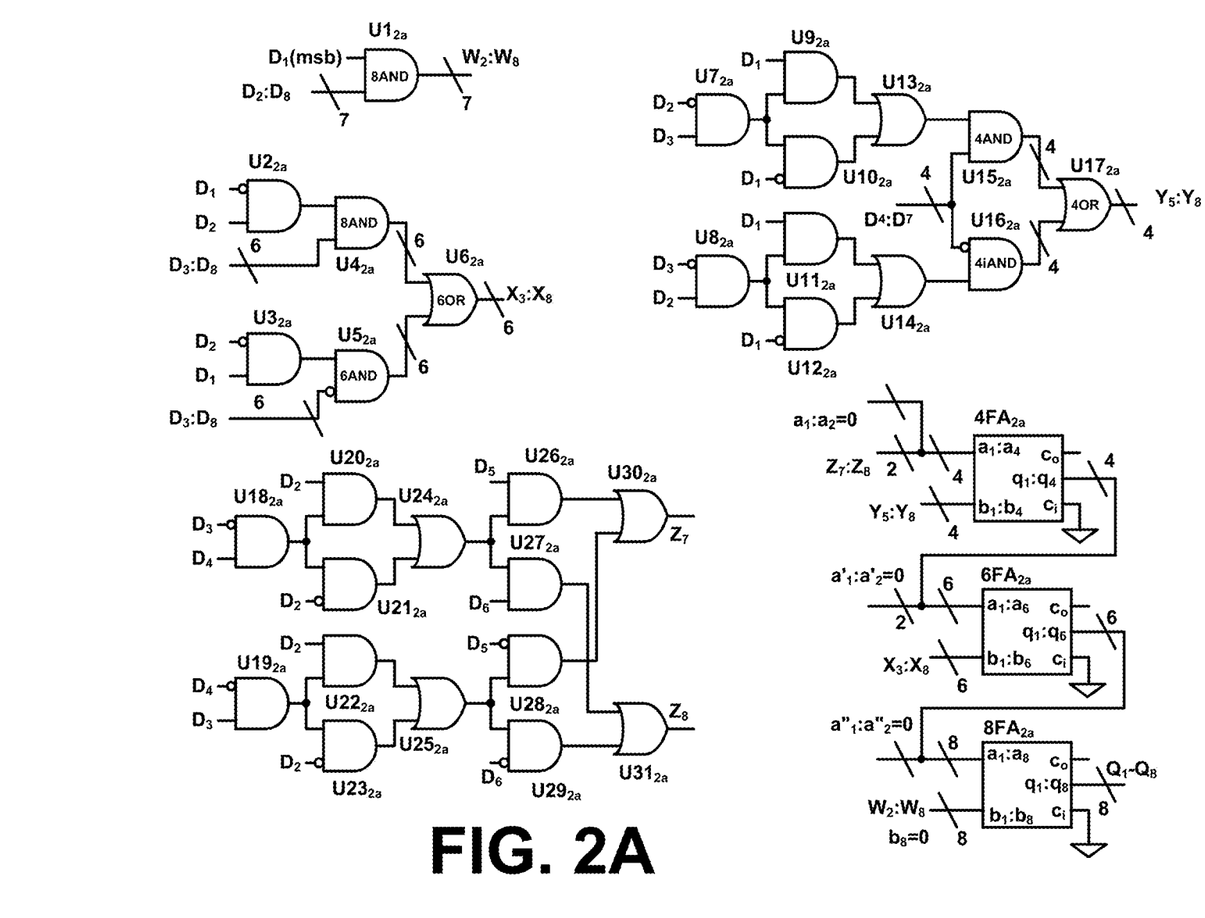
FIG. 2A is a simplified asynchronous combinational logic embodiment of the aSQR method.

Section 2A—Description of FIG. 2A

FIG. 2A is a simplified asynchronous combinational logic embodiment of the aSQR method.

Here, the digital input word Di is an 8-bit wide word (D1:D8) where D1 is the Most-Significant-Bit (MSB) and D8 is the Least-Significant-bit (LSB).

In the asynchronous embodiment of aSQR method depicted in FIG. 2A, the MSB (D1) is gated with eight AND gates ($U1_{2a}$) to generate W2:X8 which is a 7-bit digital word equivalent to the P1 digital word of FIG. 1A'.

The $D1/\overline{D1}$ and $D2/\overline{D2}$ bits are inputted to a combinational logic (comprised of $U2_{2a}$, and $U3_{2a}$) to control the D3:D8 and $\overline{D3:D8}$ bits through a pair of six AND gates ($U4_{2a}$, and $U5_{2a}$). The digital outputs of $U4_{2a}$, and $U5_{2a}$, are added by six OR gates ($U6_{2a}$) to generate X3:X8 which is a 6-bit word, equivalent to the P2 of digital word FIG. 1A'.

The $D1/\overline{D1}$, $D2/\overline{D2}$, and $D3/\overline{D3}$ bits are inputted to a combinational logic (comprised of $U7_{2a}$, through $U14_{2a}$) to control the D4:D7 and $\overline{D4:D7}$ bits through a pair of four AND gates ($U15_{2a}$, and $U16_{2a}$). The digital outputs of $U15_{2a}$, and $U16_{2a}$, outputs are added by six OR gates ($U17_{2a}$) to generate Y4:Y8 which is a 4-bit word, equivalent to the P3 digital word of FIG. 1A'.

The $D1/\overline{D1}$, $D2/\overline{D2}$, and $D3/\overline{D3}$ bits are inputted to a combinational logic (comprised of $U17_{2a}$ through $U14_{2a}$) to control the D4:D7 and D4:D7 bits through a pair of four AND gates ($U15_{2a}$ and $U16_{2a}$). The digital outputs of $U15_{2a}$ and $U16_{2a}$ are added by six OR gates ($U17_{2a}$) to generate Y4:Y8 which is a 4-bit word, equivalent to the P3 digital word of FIG. 1A'.

The $D2/\overline{D2}$, $D3/\overline{D3}$, $D4/\overline{D4}$, $D5/\overline{D5}$, and $D6/\overline{D6}$ bits are inputted to a combinational logic (comprised of $U18_{2a}$ through $U32_{2a}$) to generate Z7:Z8 which is a 2-bit word, equivalent to the P4 digital word of FIG. 1A'.

The 4-bit full adder $4FA_{2a}$ adds the 2-bit wide digital word Z7:Z8 (with proper scaling via arranging a1:a2=0) to the 4-bit wide Y5: Y8 digital word. Then, the Q1:Q4 four-bit wide digital output word of $4FA_{2a}$ (with proper scaling via arranging a1':a2'=0) is added the 6-bit wide digital word X3:X8 through the 6-bit full adder $6FA_{2a}$. Next, the Q1:Q6 six-bit wide digital output word of $6FA_{2a}$ (with proper scaling via arranging a1":a2"=0) is added the 8-bit wide digital word W2:W8 (with b8=0) through the 8-bit full adder $8FA_{2a}$.

The 8-bit digital output word Q1:Q8 of $8FA_{2a}$ represents the equivalent to the S4 digital word of FIG. 1A'.

Figure 3A:
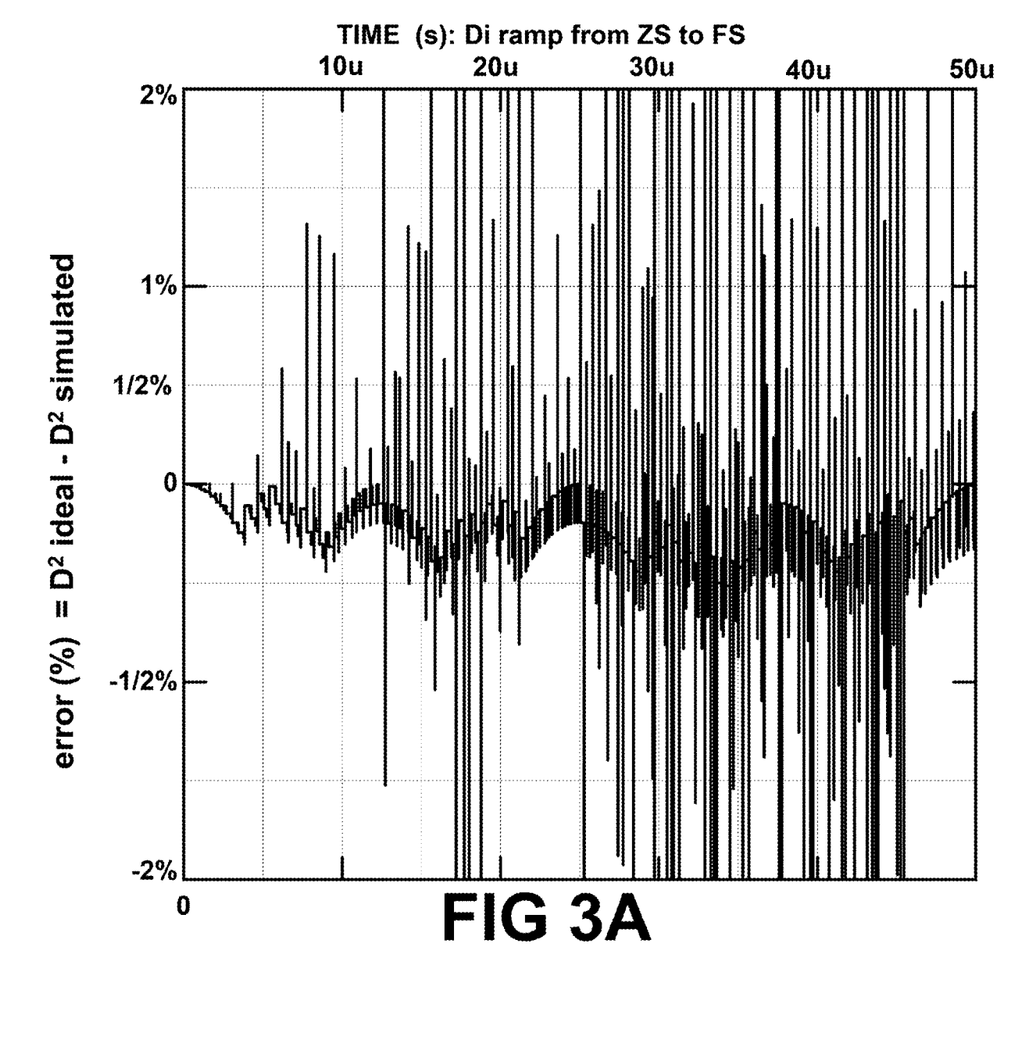
FIG. 3A is a circuit simulation showing the error (deviation from an ideal square) attributed to the asynchronous digital approximate squarer of FIG. 2A.

The SPICE simulation of digital design in FIG. 2A illustrates the precision of the approximation of the squarer method or aSQR, which is depicted in FIG. 3A and described next in section 3A.

It is obvious to one skilled in the art that other combination logic designs can be implemented in accordance with the aSQR method. Moreover, it is known by those skilled in

14 the arts that for asynchronous logic, alternative digital IC embodiments (e.g., flip-flops, clocked latches, etc.) may be utilized to prevent (e.g., adder output, etc.) glitches due to intermediate digital values rippling through the stages of digital IC logic paths. Also, keep in mind that for clarity of illustration of FIG. 2A is kept to a simple combinational logic design that does not show details such as fan-in, fan-out, and equalized delay paths.

The benefits of approximate squarer summarized in sections 1A and 1A' are applicable here to FIG. 2A.

Section 3A—Description of FIG. 3A

FIG. 3A is a circuit simulation showing the error (deviation from an ideal square) attributed to the asynchronous approximate squarer of FIG. 2A with four interpolations. Bear in mind that the illustrated simulations here are intended to further clarify the disclosed aSQR method and do not limit the disclosed aSQR method.

The horizontal axis shows the digital input word Di spanning from zero scale (ZS) at zero milli-seconds (ms) to full scale (FS) at 50 µs.

The vertical axis shows the percent (%) of inaccuracy of the asynchronous squarer of FIG. 2A with four interpolations ($S_4$) as compared to an ideal square ($D_i$) indicating an error of about 0.4% for $S_4$–$Di^2$, which is constant with simulation results depicted in lower graph of FIG. 1A" for $S_4$–$Di^2$.

What is claimed:

1. An approximate digital squaring (aSQR) method in a digital state machine in an integrated circuit (IC), the digital state machine in the integrated circuit (IC) comprising at least one of an input port, an output port, a digital memory apparatus, a digital adder apparatus, a digital subtractor apparatus, a digital divider apparatus, a digital accumulator apparatus, and a digital maximum selector apparatus, the method comprising:
  receiving a digital input word (D) at the input port, wherein the digital input word (D) has a digital value spanning from zero scale (ZS) to full scale (FS);
  programming a number of digital interpolation clock steps (n) in the digital state machine;
  initializing each digital word of a digital array O in the digital memory apparatus to zero, wherein the digital array O is comprised of a plurality of digital words $O_j$;
  initializing each digital word of a digital array P in the digital memory apparatus to zero, wherein the digital array P is comprised of a plurality of digital words $P_j$;
  programming the digital state machine beginning at a first digital interpolation clock step of j=1 and ending at a last digital interpolation clock step of j=n, generating and storing a sequence of digital words into the plurality of digital words $O_j$ in the digital memory apparatus by, at each clock step j:
    generating, in the digital divider apparatus, an array of offset values equal to full scale (FS) divided by $2^j$ to generate a digital offset equal to $$\frac{FS}{2^j},$$

accumulating, in the digital accumulator apparatus, a sum of the plurality of digital words $P_j$ and multiplying the sum of the plurality of digital words $P_j$ by 2 to generate a digital accumulated sum equal to $\Sigma_{k=1}^{j-1} 2P_j$;

adding, in the digital adder apparatus, the digital offset to the digital accumulated sum to generate a sum offset equal to $$\left\{ \sum_{k=1}^{j-1} 2P_j + \frac{FS}{2^j} \right\};$$

subtracting, in the digital subtractor apparatus, the sum offset from the digital input word (D) to generate an output signal equal to $$O_j = D - \left\{ \sum_{k=1}^{j-1} 2P_j + \frac{FS}{2^j} \right\};$$

and generating, in the digital maximum selector apparatus, and storing a selected digital sequence into the plurality of digital words $P_j$, by respectively selecting a maximum from the plurality of digital words $O_j$ and zero scale (ZS).

2. The approximate digital squaring (aSQR) method in a digital state machine in an integrated circuit (IC), the digital state machine in the integrated circuit (IC) comprising at least one of the input port, the output port, the digital memory apparatus, the digital adder apparatus, the digital subtractor apparatus, the digital divider apparatus, the digital accumulator apparatus, and the digital maximum selector apparatus of claim 1, the method further comprising:

beginning at the first digital interpolation clock step of j=1 and ending at the last digital interpolation clock step of j=n, generating a $S_n$ signal that is a summation of a product of $P_j$ and $\frac{1}{2}^{(j-2)}$, in the digital adder apparatus, equal to $$\left\{ \sum_{j=1}^{n} \frac{P_j}{2^{j-2}} \right\}.$$

3. The approximate digital squaring (aSQR) method in a digital state machine in an integrated circuit (IC), the digital state machine in the integrated circuit (IC) comprising at least one of the input port, the output port, the digital memory apparatus, the digital adder apparatus, the digital subtractor apparatus, the digital divider apparatus, the digital accumulator apparatus, and the digital maximum selector apparatus of claim 2, the method further comprising:

wherein the Sn signal represents a first $S_n$ signal;
generating another Sn signal, wherein the another $S_n$ signal represents a second $S_n$ signal; and
subtracting, in at least one of the digital subtractor apparatus and a second digital subtractor apparatus, the first Sn signal from the second Sn signal.

4. A method of generating an approximate square (aSQR) of input signals in an approximate squarer integrated circuit (IC), the approximate squarer integrated circuit (IC) comprising at least one of a subtracting apparatus, a summation apparatus, a maximum-selecting apparatus, and a scaling apparatus, the method comprising:

generating, during a first clock step (J1), a first offsetted output signal (O1) by:
generating, in the scaling apparatus, a one-half full scale signal (HS) by scaling a full scale signal (FS) by a factor of one-half;
subtracting, in the subtracting apparatus, the one-half full scale signal (HS) from an input signal (D), wherein the input signal (D) has a maximum range equal to the full-scale signal (FS);
selecting, during the first clock step (J1), in the maximum-selecting apparatus, a first positive P signal (P1) that is a maximum of the first offsetted output signal (O1) and a zero-scale signal (ZS), wherein the input signal (D) has a minimum range equal to the zero-scale signal (ZS);
generating, during a second clock step (J2), a second offsetted output signal (O2) by:
generating, in the scaling apparatus, a one-fourth full scale signal (QS) by scaling the full scale signal (FS) by a factor of one-fourth;
generating, in the scaling apparatus, a double first positive P signal (P1) by scaling the first positive P signal (P1) by a factor of two;
subtracting, in the subtracting apparatus, the one-fourth full scale signal (QS) and the double first positive P signal (P1) from the input signal (D);
selecting, during the second clock step (J2), in the maximum-selecting apparatus, a second positive P signal (P2) that is the maximum of the second offsetted output signal (O2) and the zero-scale signal (ZS); and
generating, during the second clock step (J2), a second approximate square signal (S2) by summing, in the summing apparatus, the double first positive P signal (P1), and the second positive P signal (P2).

5. The method of generating an approximate square (aSQR) of input signals in an approximate squarer integrated circuit (IC), the approximate squarer integrated circuit (IC) comprising at least one of the subtracting apparatus, the summation apparatus, the maximum-selecting apparatus, and the scaling apparatus of claim 4, the method further comprising:

generating, during a third clock step (J3), a third offsetted output signal (O3) by:
generating, in the scaling apparatus, a one-eighth full scale signal (ES) by scaling the full scale signal (FS) by a factor of one-eighth;
generating, in the summing apparatus, a P1+P2 signal by summing the first positive P signal (P1) and the second positive P signal (P2);
generating, in the scaling apparatus, a double P1+P2 signal by scaling the P1+P2 signal by a factor of two;
subtracting, in the subtracting apparatus, the double P1+P2 signal and the one-eighth full scale signal (ES) from the input signal (D);
selecting, during the third clock step (J3), in the maximum-selecting apparatus, a third positive P signal (P3) that is a maximum of the third offsetted output signal (O3) and the zero-scale signal (ZS);
generating, during the third clock step (J3), a third approximate square signal (S3) by:
generating, in the scaling apparatus, a one-half third positive P signal (P3) by scaling the third positive P signal (P3) by a factor of one-half; and
summing, in the summation apparatus, the double first positive P signal (P1), the second positive P signal (P2), and the one-half third positive P signal (P3).

\* \* \* \* \*